(12) United States Patent
Chan

(10) Patent No.: US 10,290,360 B2
(45) Date of Patent: May 14, 2019

(54) METHODS, SYSTEMS, AND MEDIA FOR PROGRAMMING A STORAGE DEVICE

(71) Applicants: GIGADEVICE SEMICONDUCTOR (SHANGHAI) INC., Shanghai (CN); GIGADEVICE SEMICONDUCTOR (BEIJING) INC., Beijing (CN); GIGADEVICE SEMICONDUCTOR (HEFEI) INC., Hefei (CN)

(72) Inventor: Siulung Chan, San Jose, CA (US)

(73) Assignees: GIGADEVICE SEMICONDUCTOR (SHANGHAI) INC., Shanghai (CN); GIGADEVICE SEMICONDUCTOR (BEIJING) INC., Beijing (CN); GIGADEVICE SEMICONDUCTOR (HEFEI) INC., Hefei (CN)

( * ) Notice: Subject to any disclaimer, the term of this patent is extended or adjusted under 35 U.S.C. 154(b) by 79 days.

(21) Appl. No.: 15/535,821

(22) PCT Filed: Nov. 2, 2015

(86) PCT No.: PCT/CN2015/093598
§ 371 (c)(1),
(2) Date: Jun. 14, 2017

(87) PCT Pub. No.: WO2017/075747
PCT Pub. Date: May 11, 2017

(65) Prior Publication Data
US 2018/0350443 A1    Dec. 6, 2018

(51) Int. Cl.
*G11C 16/34* (2006.01)
*G11C 11/56* (2006.01)
(Continued)

(52) U.S. Cl.
CPC ...... *G11C 16/3459* (2013.01); *G11C 11/5628* (2013.01); *G11C 16/30* (2013.01);
(Continued)

(58) Field of Classification Search
CPC ............ G11C 16/3459; G11C 16/3463; G11C 16/3404; G11C 16/30; G11C 16/0483;
(Continued)

(56) References Cited

U.S. PATENT DOCUMENTS

2009/0319825 A1   12/2009   Yang et al.
2010/0332951 A1   12/2010   Peng et al.
(Continued)

OTHER PUBLICATIONS

International Search Report for PCT/CN2015/093598 dated Aug. 10, 2016, 4 pages.
(Continued)

*Primary Examiner* — Harry W Byrne
*Assistant Examiner* — Sultana Begum
(74) *Attorney, Agent, or Firm* — Metis IP LLC

(57) ABSTRACT

Methods, systems, and machine-readable storage medium for programming a storage device are disclosed. In some embodiments, the methods include: performing a verify operation on a plurality of storage elements of the storage device to determine whether the plurality of storage elements have been programmed to a first program state; determining a first number of failing bits corresponding to the first program state based on the verify operation; comparing the first number of failing bits with a first threshold of failing bits corresponding to the first program state; and determining a second threshold of failing bits based at least in part on the first number of failing bits and the comparison, wherein the second threshold of failing bits corresponds to a second program state.

20 Claims, 11 Drawing Sheets

(51) Int. Cl.
*G11C 16/30* (2006.01)
*G11C 29/44* (2006.01)
*G11C 29/52* (2006.01)
*G11C 16/04* (2006.01)

(52) U.S. Cl.
CPC ...... *G11C 16/3404* (2013.01); *G11C 16/3463* (2013.01); *G11C 29/44* (2013.01); *G11C 29/52* (2013.01); *G11C 16/0483* (2013.01); *G11C 2211/5621* (2013.01)

(58) Field of Classification Search
CPC ......... G11C 16/10; G11C 16/26; G11C 29/52; G11C 29/44; G11C 11/5628; G11C 2211/5621
See application file for complete search history.

(56) References Cited

U.S. PATENT DOCUMENTS

2014/0189442 A1    7/2014  DeGraaf et al.
2017/0117055 A1*   4/2017  Kim ................... G11C 16/3459

OTHER PUBLICATIONS

Written Opinion for PCT/CN2015/093598 dated Aug. 10, 2016, 5 pages.

* cited by examiner

METHODS, SYSTEMS, AND MEDIA FOR
PROGRAMMING A STORAGE DEVICE

CROSS-REFERENCE TO RELATED APPLICATIONS

This application is a U.S. national stage under 35 U.S.C. § 371 of International Application No. PCT/CN2015/093598, filed on Nov. 2, 2015, designating the United States of America. The above-referenced application is expressly incorporated herein by reference in its entirety.

TECHNICAL FIELD

The present disclosure relates to methods, systems, and machine-readable media for programming a storage device.

BACKGROUND

Storage devices, such as devices utilizing non-volatile memories, have been widely used in mobile telephones, digital cameras, tablet computers, and other computing devices. A non-volatile memory typically does not require power to retain data and can retrieve stored information even after having been power cycled (e.g., turned off and back on). Examples of non-volatile storage devices include NOR flash memories, NAND flash memories, read-only memories, etc.

SUMMARY

Methods, systems, and machine-readable storage media for programming a storage device are disclosed. In some embodiments, the methods include: performing a verify operation on one or more storage elements of the storage device to determine whether the storage elements have been programmed to a first program state; determining a first number of failing bits corresponding to the first program state based on the verify operation; comparing the first number of failing bits with a first threshold of failing bits corresponding to the first program state; and determining a second threshold of failing bits based at least in part on the first number of failing bits and the comparison, wherein the second threshold of failing bits corresponds to a second program state.

In some embodiments, the methods further include determining a second number of failing bits representative of a difference between the first number of failing bits and the first threshold of failing bits.

In some embodiments, the methods further include combining an initial value of the second threshold of failing bits and the second number of failing bits.

In some embodiments, the methods further include determining whether a threshold of program pulses have been applied to the plurality of storage elements.

In some embodiments, the methods further include applying a verify pulse to the plurality of storage elements.

In some embodiments, the methods further include determining multiple threshold voltages corresponding to the plurality of storage elements; and determining whether the plurality of threshold voltages have reached a target threshold voltage distribution.

In some embodiments, the methods further include determining a number of the storage elements that have not been programmed to the first program state.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
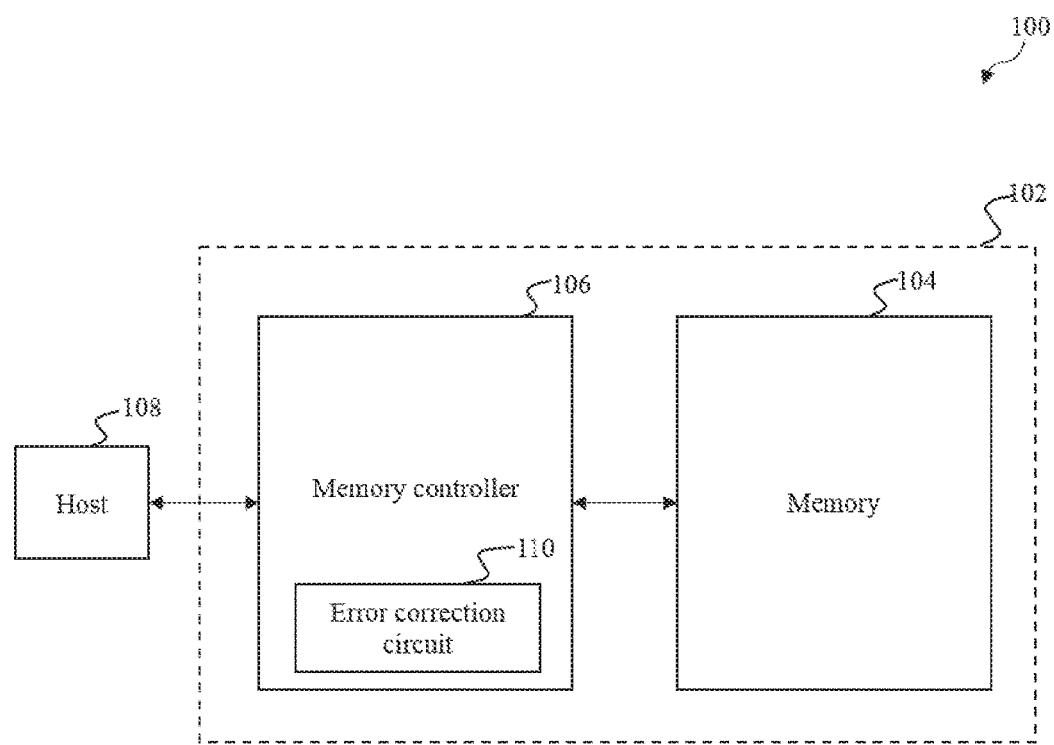
FIG. 1 illustrates an example of a system for programming a storage device in accordance with some embodiments of the disclosed subject matter.

In accordance with various implementations, as described in more detail below, mechanisms, which can include systems, methods, and machine-readable media, for programming a storage device are provided.

Prior solutions for programming storage devices (e.g., a storage device including a non-volatile memory) do not provide a scheme for dynamic error count calculation. For example, these prior solutions typically associate a program state with a fixed parameter indicative of the number of failing bits allowed for the program state. Upon performing a program operation to program a storage device to the program state, these prior solutions may detect the number of failing bits during the program operation and may verify whether the number of failing bits is greater than the fixed parameter. If the number of detected failing bits is greater than the fixed parameter, the prior solutions may determine that the programming process is not successful. The prior solutions may then end the programming process by skipping subsequent program states to be programmed and/or verified for the storage device.

Aspects of the disclosure address the above deficiencies by providing mechanisms (e.g., systems, methods, machine-readable media, etc.) for programming a storage device utilizing a scheme for dynamic error count calculation. For example, the mechanisms can dynamically calculate the number of bits that are allowed to fail corresponding to a current program state based on the number of failing bits detected during program operations performed for one or more previous program states (e.g., program states that have been verified for the storage device).

As another example, the mechanisms may associate a program state with a threshold number of program pulses indicative of the maximum number of program pulses that can be applied to the storage device to program the storage device to the program state. Upon applying the threshold number of program pulses to the storage device and determining that the storage device has not been programmed to the program state, the mechanisms may determine the number of failing bits corresponding to the program state (e.g., by performing a bitscan operation). The mechanisms may then determine a threshold of failing bits for a next program state based on the detected number of failing bits (e.g., by determining a difference between the detected number of failing bits and a threshold of failing bits corresponding to the first program state, by subtracting the difference form a threshold of failing bits corresponding to the next program state, etc.). As such, the mechanisms may increase yield rates when programming the storage device.

The mechanisms can program one or more storage elements of the storage device to one or more program states. Each of the program states may correspond to a threshold voltage distribution and/or a target threshold voltage. A storage element of the storage device may be regarded as having been programmed to a given program state when a threshold voltage of the storage element is equal to or greater than the target threshold voltage corresponding to the given program state. Alternatively or additionally, the storage element can be regarded as having been programmed to the given program state when the threshold voltage of the storage element falls within the threshold voltage distribution corresponding to the given program state.

In some embodiments, multiple program states may correspond to one or more thresholds of failing bits. For example, each of the programs state can correspond to an individual threshold of failing bits representing a number of bits that are allowed to fail to successfully program one or more storage elements to the program state. In some embodiments, a first program state, a second program state, and a third program state can correspond to a first threshold of failing bits, a second threshold of failing bits, and a third threshold of failing bits, respectively. The first threshold, the second threshold, and the third threshold may or may not be the same.

As another example, the program states can correspond to a threshold of failing bits indicative of a total number of bits that are allowed to fail to successfully program the storage elements to the program states. In some embodiments, the threshold of failing bits can be a combination of the individual failing bits corresponding to the program states. Each of the program states can correspond to a threshold number of program pulses.

In some embodiments, the mechanisms can initiate a verification process by applying a program pulse to one or more storage elements of the storage device (e.g., a page of storage elements coupled to a word line of the storage device) to program the storage elements to the first program state. The mechanisms can then verify whether each of the storage elements have been programmed to the first program state (e.g., by applying a verify pulse to the storage elements, determining whether a threshold voltage of each of the storage elements is equal to or greater than a target threshold voltage, and/or performing any other operation). The mechanisms can also determine the number of failing bits corresponding to the first program state (e.g., by performing a bitscan operation).

In some embodiments, the mechanisms can determine that the storage elements have passed the verification process in response to determining that the number of failing bits corresponding to the first program state is not greater than a first threshold of failing bits corresponding to the first program state (e.g., a predetermined value). The mechanisms can also determine a threshold of failing bits for the second program state to be verified (e.g., by adding a difference between the number of detected failing bits and the first threshold of failing bits to the second threshold of failing bits).

In some embodiments, in response to determining that the number of failing bits corresponding to the first program state is greater than the first threshold of failing bits, the mechanisms can apply another program pulse to program the storage elements to the first program state. In some embodiments, in response to determining that the number of failing bits corresponding to the first program state is greater than the first threshold of failing bits and that a threshold number of program pulses have been applied to the storage elements to program the storage elements to the first program state, the mechanisms can determine that the storage elements have not passed the verification process. The mechanisms can also determine a threshold of failing bits for the next program state to be verified (e.g., by subtracting the difference between the number of detected failing bits and the first threshold of failing bits from the second threshold of failing bits).

FIG. 1 illustrates an example 100 of a system for programming a storage device in accordance with some embodiments of the disclosed subject matter. As shown, system 100 can include one or more storage devices 102, hosts 108 and/or any other suitable component.

Storage device 102 can include one or more memories 104, memory controllers 106, and/or any other suitable component. In one embodiment, the storage device 102 can be and/or include a storage device 200 as described below in connection with FIG. 2. Each of memory 104, memory controller 106, and host 108 may include any hardware, firmware, software, etc.

Memory 104 can include multiple storage elements, each of which can include one or more transistors (e.g., one or more storage elements as described below in connection with FIGS. 4A-4B). The storage elements can be arranged in one or more arrays (e.g., one or more arrays as will be described in connection with FIG. 2). Multiple storage elements in memory 104 can be organized serially, in parallel, or in any other suitable manner. In some embodiments, memory 104 may be and/or include a non-volatile memory, such as a NAND flash memory.

Host 108 may include an operating system, one or more user applications, interfaces, drivers, etc. Memory controller 106 may provide an interface to facilitate data transfer and/or communications between host 108 and memory 104. Host 108 and/or memory controller 106 may perform one or more operations on memory 104. For example, memory 104 can perform one or more program operations (e.g., by writing a data sequence to a portion of memory 102 identified by an address), erase operations (e.g., by erasing a data sequence to a portion of memory 102 identified by an address), read operations (e.g., by reading a data sequence stored at a portion of memory 102 identified by an address), verify operations, and/or any other suitable operation. In some embodiments, host 108 and/or memory controller 106 may program memory 102 by performing one or more operations described below in connection with FIGS. 2-11.

Memory controller 106 can also perform one or more operations to manage and/or control memory 104 and/or any other component of system 100. For example, memory control 106 can include an error correction circuit 110 that can perform error detection and/or error correction operations for memory 104. In some embodiments, data about failing bits detected during one or more program operations can be transferred from memory 102 to memory controller 106 and can then be corrected by error correction circuit 110 and/or any other component of memory controller 106.

Figure 2:
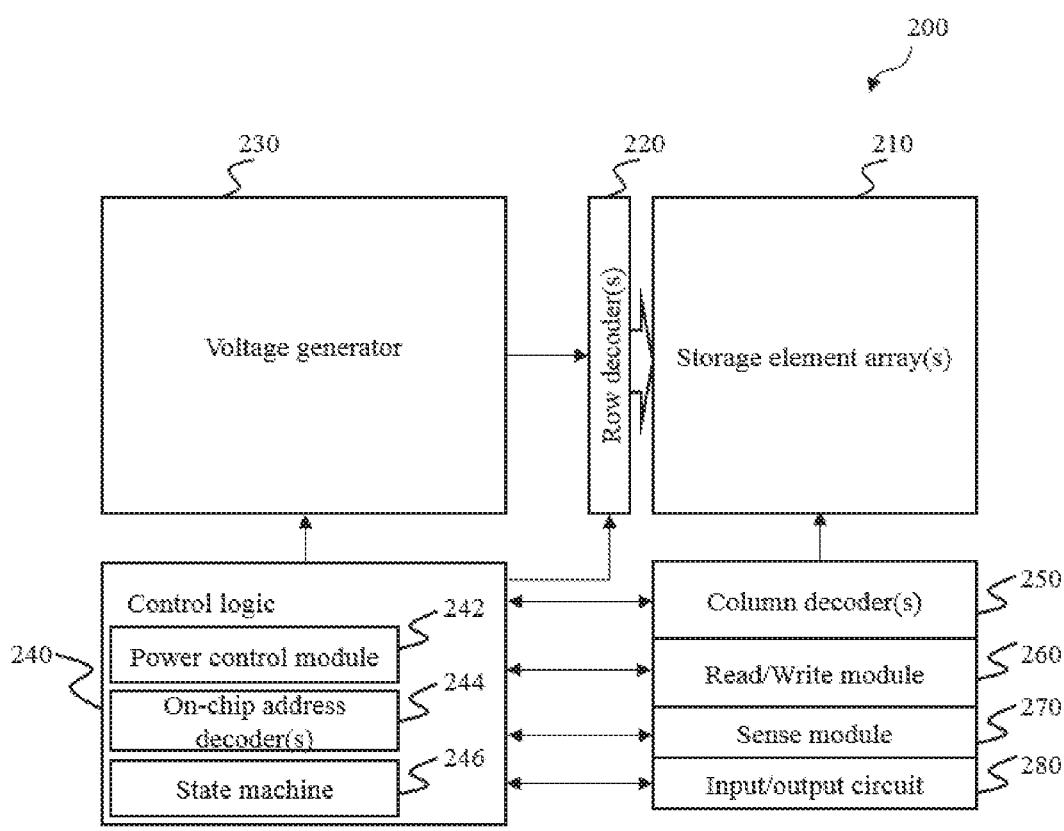
FIG. 2 is a block diagram illustrating an example of a storage device according to some embodiments of the disclosed subject matter.

FIG. 2 is a block diagram illustrating an example 200 of a storage device according to some embodiments of the present disclosure. As shown, storage device 200 can include one or more storage element arrays 210, row decoders 220, voltage generators 230, control logics 240, column decoders 250, read/write modules 260, sense modules 270, input/output circuits 280, and/or any other suitable component. In some embodiments, storage device 200 can be and/or include storage device 102 and/or host 108 of FIG. 1. For example, storage element array 210, row decoders 220, column decoders 250, read/write module 260 can be an example of the embodiment of the memory 104 in FIG. 1, whereas voltage generator 230, control logic 240, sense module 270, and I/O 280 can be an example of the embodiment of the memory controller 106 in FIG. 1. The error correction circuit 110 can be implemented in the control logic 240, or sense module 270, or any suitable component thereof.

Storage element array 210 can include one or more storage elements. Each of the storage elements can include one or more transistors. One or more of the storage elements can be implemented using the structure as shown in FIG. 4A-B.

The storage elements in storage element array 210 can be arranged in any suitable manner. For example, multiple storage elements of the storage device can be arranged in one or more rows and can be coupled to one or more word lines (WL). As another example, multiple storage elements can be arranged in one or more columns and can be connected to one or more bit lines (BL). A storage element of storage device 200 can store a certain amount of data (e.g., one or more bits of data). Each of the storage elements can store data using a charge storage layer (e.g., a floating gate, a charge trapping layer, etc.), a variable resistor, and/or any other suitable type of structure.

The storage elements in storage element array 210 can be grouped into one or more logical and/or physical units. For example, the storage elements can be grouped into one or more pages. A page may include one or more storage elements that are coupled to the same word line. A given word line of the storage device can be coupled to one or more pages of storage elements. As another example, the storage elements can be grouped into one or more blocks. In some embodiments, a block may include one or more storage elements. Data stored in the storage elements of a block can be erased by performing an erase operation. A block may include one or more pages of storage elements. In some embodiments, storage device 200 can include one or more blocks as described below in connection with FIG. 3.

Storage device 200 may include one or more row decoders 220 and row decoders 220. A row decoder 220 can perform selecting and driving operations for one or more rows of storage elements in storage element array 210. For example, row decoder 220 can select a row of the storage element array 210 to perform one or more operations. More particularly, for example, row decoder 220 can select a word line and can apply a voltage to the selected word line and/or any other word lines of the storage device (also referred to as "non-selected word lines"). In some embodiments, a contact region can be formed between the storage element array 210 and the row decoder 220 to connect the word lines and the overlying wirings to connect a plurality of word lines of the storage element array 210 to one or more transfer transistors (not shown in FIG. 2) of the row decoder 220.

Voltage generator 230 can generate voltages (e.g., one or more program pulses, pass voltages, erase voltages, read voltages, verify pulses, etc.) for performing one or more program operations, erase operations, read operations, verify operations, and/or any other suitable operation.

Control logic 240 can cooperate with one or more components of storage device 200 (e.g., voltage generator 230, row decoder 220, column decoder 250, read/write module 260, sense module 270, input/output circuit 280, etc.) to generate one or more control signals for performing one or more operations (e.g., program operations, erase operations, read operations, verify operations, etc.). The control logic 240 can include one or more power control modules 242, on-chip address decoders 244, state machines 246, etc. Power control module 242 can control the generation of power and/or voltage applied to one or more word lines or one or more bit lines during one or more operations performed on storage elements of the storage device 200. The on-chip address decoder 244 can provide information between hardware addresses (e.g., addresses that can be used by the row decoder 220 and/or the column decoder 250) and other addresses (e.g., addresses that can be used by the host 108, or memory controller 106 of FIG. 1). The state machine 246 can perform control of storage device operations at chip level, array level, block level, etc.

Column decoder 250 can perform selecting and driving operations for one or more columns of storage element array 210. For example, column decoder 250 can select a column of the storage element array 210 to perform one or more operations. More particularly, for example, column decoder 250 can select a bit line and can apply a voltage to the selected bit line and/or any other bit lines of the storage device.

Read/write module 260 can include one or more page buffers for performing read and/or write operation. In some embodiments, each of the page buffers may correspond to one or more word lines. Read/write module 260 can be and/or include a write driver controlled by control logic 240 and can operate as a write driver according to various operation modes of the storage device. For example, during a read operation, read/write module 260 can operate as a sense amplifier to sense data from one or more storage elements of a row of storage element array 210.

Sense module 270 can perform a sense operation to determine whether the threshold voltages of the storage elements have reached a target threshold voltage distribution. Sense module 270 may also perform a bitscan operation and/or any other operation to determine the number of failing bits corresponding to a program state. For example, sense module 270 can scan the bit of data (e.g., "0" or "1") stored in multiple storage elements (e.g., a page of storage elements, a portion of the page of storage elements, etc.) and determine the number of failing bits.

Input/output circuit 280 can receive read data from read/write module 260 and can transmit the data to one or more components of storage device 200 and/or any other device. During a programming operation, read/write module 260 can operate as a write driver to drive one or more storage elements of a row according to program data. Input/output circuit 280 can interact with a memory controller (e.g., memory controller 106 of FIG. 1), a host (e.g., host 108 of FIG. 1), and/or any other device.

Figure 3:
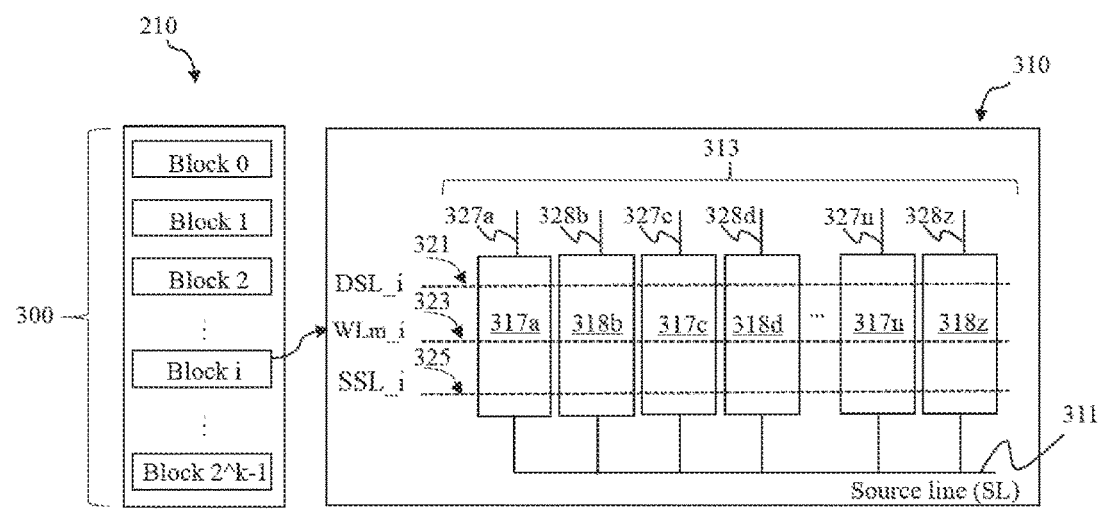
FIG. 3 is a block diagram illustrating examples of a block of storage elements in accordance with some embodiments of the disclosed subject matter.

FIG. 3 is a block diagram illustrating an example 310 of a block of storage element array 210 in accordance with some embodiments of the disclosed subject matter. As shown, storage element array 210 can include one or more blocks 300, such as 2^k−1 blocks, where k can be a non-negative integer (e.g., 0, 1, 2, 3, etc.). A block 300 can include any suitable number of storage elements. Multiple storage elements can be arranged as one or more strings of storage elements (e.g., strings 317*a*, 318*b*, 317*c*, 318*d*, 317*n*, 318*z*, etc.). In some embodiments, data stored in storage elements of a block 300 can be erased in parallel. For example, the storage elements of a block 300 can be erased during an erase operation (e.g., by applying a high voltage to the selected block and/or performing any other operation to erase data stored in the storage elements).

A block 300 may be and/or include a block 310 in some implementations. As shown in FIG. 3, Block 310 can include one or more strings of storage elements 313. Each storage element 313 may be coupled to one or more source lines (SL) 311, drain select lines (DSL) 321, source select lines (SSL) 325, word lines (WL) 323, bit lines (e.g., bit lines 327*a*, 328*b*, 327*c*, 328*d*, 327*n*, 328*z*, etc.). One or more of strings 313 may be implemented using the architectures as shown in FIGS. 4A-B. In some embodiments, multiple strings 313 can be connected to each other through DSL 321, SSL 325, and/or SL 311. In some embodiments, some storage elements in the same column can be connected in series to form a string of storage elements. The string can be coupled to a bit line via a select transistor which can be controlled by a source select line 325 and a source line SL via a select transistor. One or more strings in different blocks can be connected through a bit line.

Each block 300 of storage element array 210 can be implemented using the same or different architectures.

In some embodiments, block 310 may be implemented using an interleaving architecture. For example, strings 313 can include one or more odd strings (e.g., 317*a*, 317*c*, . . . , and 317*n*), and one or more even strings (e.g., 318*b*, 318*d*, . . . , and 318*z*). A bit line coupled to one or more odd strings (e.g., 317*a*, 317*c*, . . . , and 317*n*) may be referred to as an odd bit line (e.g., 327*a*, 327*c*, . . . , and 327*n*). Similarly, a bit line coupled to one or more even strings (e.g., 318*b*, 318*d*, . . . , and 318*z*) may be referred to as an even bit line (e.g., 328*b*, 328*d*, . . . , and 328*z*). The bit lines of block 310 can be grouped into one or more bit line pairs, each of which can include an even bit line and an odd bit line. The bit line pairs can be coupled to one or more registers (e.g., page buffers) in a read/write module 260 of FIG. 2.

In block 310, storage elements coupled to a given word line may be programmed during multiple program operations. For example, storage elements that are coupled to a given word line and one or more odd bit lines may be programmed in a first programming round, while storage elements that are coupled to a common word line and one or more even bit lines can be programmed in a second programming round. In some embodiments, the storage elements may be programmed based on the programming mechanism as shown in FIG. 6B.

In some embodiments, block 310 may be implemented using an all bit line architecture. For example, the bit lines of block 310 can be selected and read simultaneously or substantially simultaneously. Multiple storage elements that are coupled to a word line and the bit lines can be programmed in parallel. The bit lines of block 310 can be coupled to one or more registers (e.g., page buffers) in a read/write module 260 of FIG. 2.

Figures 4A, 4B:
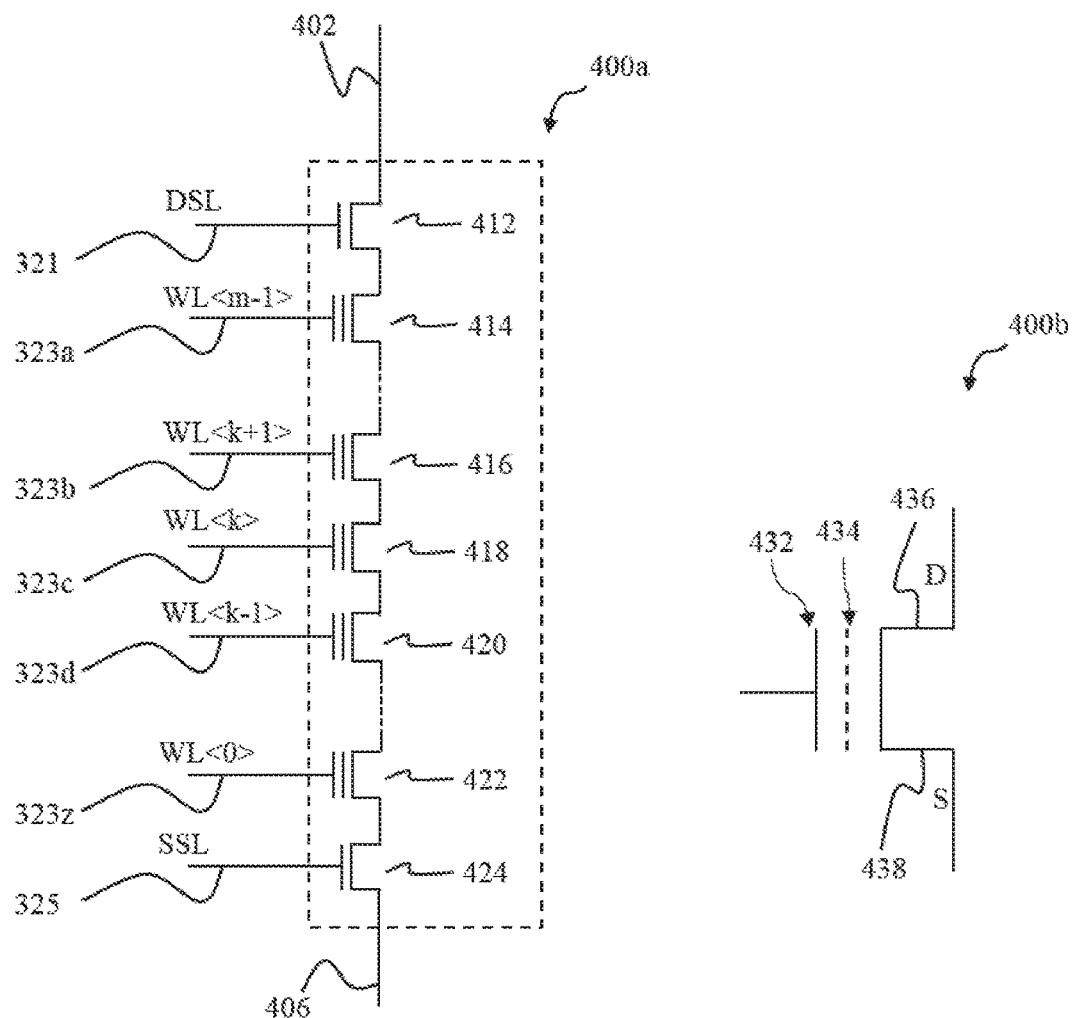
FIG. 4A illustrates an example of a string of storage elements in accordance with some embodiments of the disclosed subject matter.
FIG. 4B illustrates an example of a storage element in accordance with some embodiments of the disclosed subject matter.

FIG. 4A illustrates an example 400*a* of a string of storage elements in accordance with some embodiments of the disclosure. As shown, string 400*a* can include one or more select gate (e.g., 412, 424, etc.) and one or more transistors (e.g., 414, 416, 418, 420, 422, 424, etc.). In one embodiment, select gate 412 is on the source side, and connect the string of storage elements 400*a* to the source line 402. Select gate 424 is on the drain side, and connect the string of storage elements 400*a* to the source line 406. An appropriate voltages can be applied to select line DSL 321 for controlling select gate 412. An appropriate voltages can be applied to select line SSL 325 for controlling select gate 424. Transistors of the string of storage elements 400*a* may be same or different. In one embodiment, one or more of transistors 414, 416, 418, 420, 422, and 424 can be implemented using the structure as shown in FIG. 4B. Each of the transistors can have a control gate 432 and a floating gate 434 respectively. Every control gate of the transistors can be connected to the corresponding word line. For example, control gate of transistor 414 can be connected to the word line 323*a*, and control gate of transistor 416 can be connected to the word line 323*b*.

In one embodiment, a storage system based on a NAND structure has several strings. When the storage device 200 perform a program operation, a word line can be apply a voltage (e.g., Vpgm) to be selected, and other word line can be apply another voltage (e.g., Vpass) to not be selected. For example, in order to program storage elements of transistor 418 of bite line 402, a Vpgm voltage can be applied to word line 323*c*, and a Vpass voltage can be applied to word line 323*b* and 323*d*.

Referring to FIG. 4B, it illustrates an example 400*b* of one schematic structure of a storage element which can be a transistor 414-422 in FIG. 4A. Storage element 400*b* can include one or more control gate 432, floating gate 434, drain region 436, source region 438 and/or any other suitable component. The storage element 400*b* may be and/or include a MOSFET. Storage element 400*b* can store information using a charge storage layer such as a floating gate, a variable resistor, a charge trapping layer, and/or any other suitable type of memory element. In FIG. 4B, the charge storage layer is a floating gate 434. Each storage element can store 1-bit data when it is a traditional single-level cell, or store M-bit data where M is an integer more than one when it is a multi-level cell or triple-level cell.

Figure 5A:
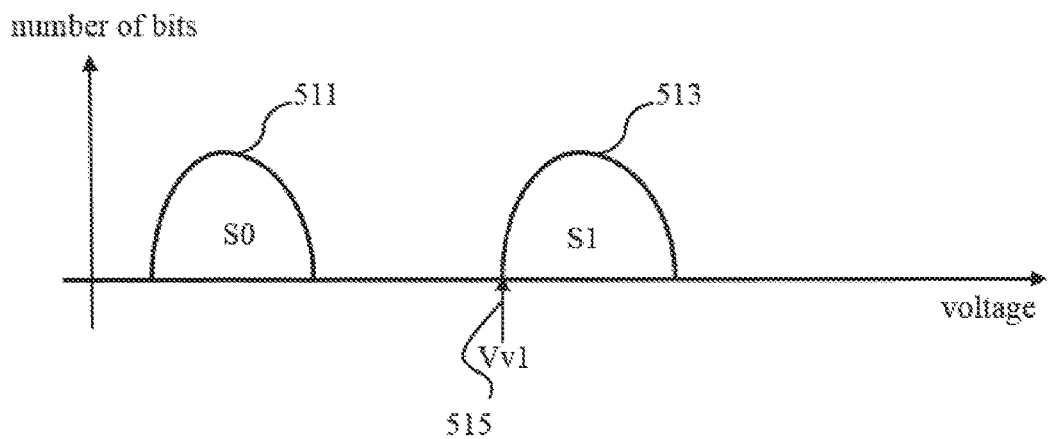
FIGS. 5A, 5B and 5C are diagrams illustrating examples of program states corresponding to storage elements that can store various amounts of data in accordance with some embodiments of the disclosed subject matter.
Figure 5B:
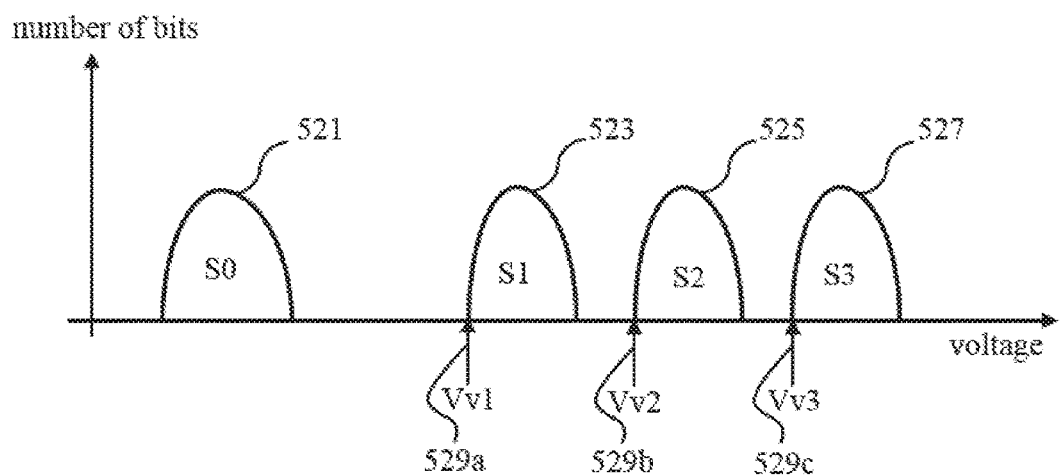
Figure 5C:
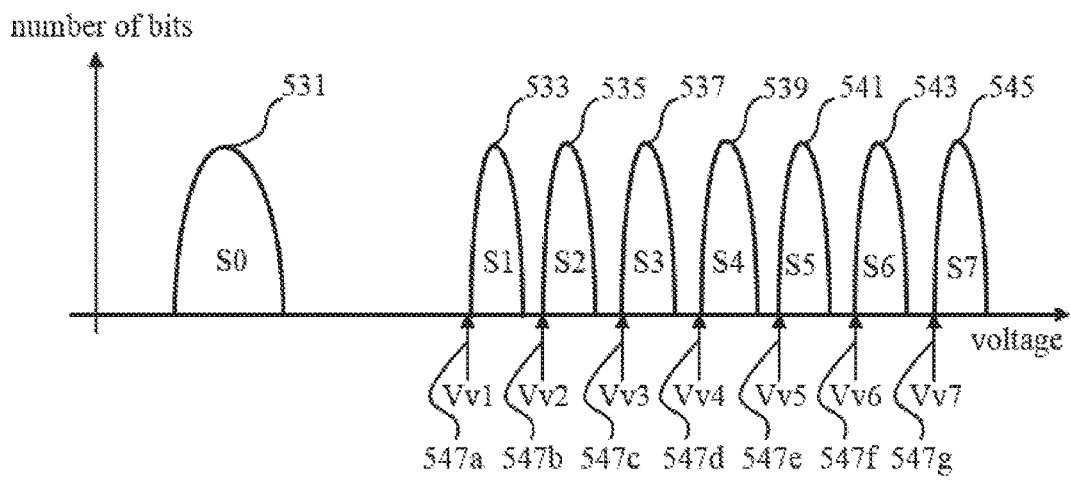

FIGS. 5A, 5B and 5C are diagrams illustrating examples of program states corresponding to storage elements that can store various amounts of data in accordance with some embodiments of the present disclosure.

Turning to FIG. 5A, examples 511 and 513 of threshold voltage distributions corresponding to various program states in accordance with some embodiments of the disclosed subject matter are shown. As illustrated, threshold voltage distributions 511 and 513 may correspond to program states "S0" and "S1", respectively. In some embodiments, each of program states "S0" and "S1" can correspond to particular data stored in a storage element (e.g., a value of "0," a value of "1," etc.).

Each of threshold voltage distributions 511 and 513 can correspond to a distribution of target threshold voltages of storage elements that are programmed to states "S0" and "S1," respectively. For example, a storage element can be regarded as having been programmed to program state "S0" when a threshold voltage of the storage element falls within threshold voltage distribution 511. As another example, a storage element can be regarded as having been programmed to program state "S1" when a threshold voltage of the storage element falls within threshold voltage distribution 513. In some embodiments, each of threshold voltage distributions 511 and 513 can correspond to a distribution of threshold voltages of erased storage elements or a distribution of threshold voltages of programmed storage elements.

In some embodiments, program state "S1" and/or threshold voltage distribution 513 can correspond to a verify voltage 515. Verify voltage 515 may correspond to a target threshold voltage to be achieved during a programming process. For example, a storage element having been programmed to program state "S1" may have a threshold voltage that is equal to or greater than verify voltage 515.

Referring to FIG. 5B, examples of program states corresponding to storage elements that can store two logic bits of data (also referred to herein as "2-bit storage elements") in accordance with some embodiments of the disclosed subject matter are shown. As illustrated, a 2-bit storage element can be programmed to one or more of program states "S0," "S1," "S2," and "S3" corresponding to threshold voltage distributions 521, 523, 525, and 527, respectively. Each of threshold voltage distributions 521, 523, 525, and 527 can represent a distribution of target threshold voltages of storage elements programmed to a corresponding program state. For example, a 2-bit storage element can be regarded as having been programmed to program state "S0," "S1," "S2," and "S3," when a threshold voltage of the 2-bit storage element falls within threshold voltage distributions 521, 523, 525, and 527, respectively.

Each of program states "S0," "S1," "S2," and "S3" may correspond to a value of data stored in a 2-bit storage element, such as a value of "11", a value of "10", a value of "01", a value of "00," and/or any other suitable value of data.

In some embodiments, program state "S0" and/or threshold voltage distribution 521 may correspond to a distribution of threshold voltages of erased storage elements. Each of program states "S1," "S2," and "S3" and/or threshold voltage distributions 523, 525, and 527 may correspond to a distribution of threshold voltages of storage elements that have been programmed to store a value of data (e.g., "00," "01," "10," "11," etc.).

In some embodiments, program states "S1," "S2," and "S3" may correspond to verify voltages 529a, 529b, and 529c, respectively. Each of verify pulses 529a, 529b, and 529c can correspond to a target threshold voltage to be achieved during a programming process (e.g., a programming process described below in connection with FIGS. 8-11). For example, a storage element having been programmed to program states "S1," "S2," and "S3" may have a threshold voltage level that is equal to or greater than verify voltages 529a, 529b, and 529c, respectively.

Referring to FIG. 5C, examples of program states corresponding to storage elements that can store three bits of data (also referred to herein as "3-bit storage elements") in accordance with some embodiments of the disclosed subject matter are shown. As illustrated, a 3-bit storage element can be programmed to one or more of program states "S0," "S1," "S2," "S3," "S4," "S5," "S6," and "S7." Each of these program states may correspond to a threshold voltage distribution (e.g., one of threshold voltage distributions 531, 533, 535, 537, 539, 541, 543, and 545). Each of the program states can correspond to a value of data (e.g., three bits of data) stored in the storage element. For example, each of the program states can correspond to "111," "110," "101," "100," "011," "010," "001," "000," and/or any other suitable value. The threshold voltage distributions corresponding to program states 531, 533, 535, 537, 539, 541, 543, and 545 may or may not have the same width (e.g., a range of threshold voltages). In some embodiments, threshold voltage distribution 531 can represent a distribution of threshold voltages of erased storage elements. In some embodiments, one or more of program states 533 through 545 may represent distributions of threshold voltages of programmed storage elements.

As shown in FIG. 5C, program states 533, 535, 537, 539, 541, 543, and 545 can correspond to verify pulses 547a, 547b, 547c, 547d, 547e, 547f, and 547g, respectively. Each of verify pulses 547a-g can represent a target threshold voltage to be achieved during a programming process (e.g., a programming process illustrated in FIGS. 6A-7). For example, a storage element can be determined as having been programmed to program states 533, 535, 537, 539, 541, 543, and 545 when the threshold voltage of the storage element is equal to or greater than verify pulses 547a-g during the programming process, respectively.

Each of threshold voltage distributions 511, 513, 521, 523, 525, 527, 531, 535, 537, 539, 541, 543, and 545 can be represented using one or more of a Gaussian like distribution, a Gaussian distribution, a uniform distribution, and/or any other suitable mathematical model that can be used to represent a threshold voltage distribution. Multiple threshold voltage distributions may or may not be represented using the same mathematical model or combination of mathematical models. Each of these threshold voltage distributions may correspond to any suitable voltage value or range of voltage values (e.g., voltages below 0 volt, voltages above 0 volt, etc.).

While storage elements that can store one bit of data, two bits of data, and three bits of data are described above in conjunction with FIGS. 5A-5C, this is merely illustrative. A storage element of the memory device can store any suitable amount of data. For example, storage elements that can store n bits of data can correspond to $2^n-1$ program states and/or threshold voltage distributions, where n is a positive integer.

Figure 6A:
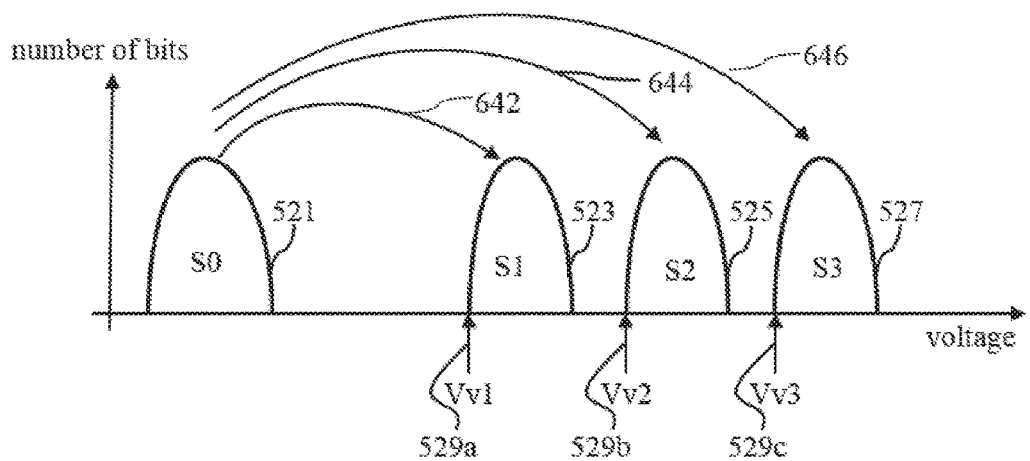
FIGS. 6A, 6B, 6C, 7A, and 7B is a diagram illustrating examples of mechanisms for programming a memory device in accordance with some embodiments of the disclosed subject matter.
Figure 6B:
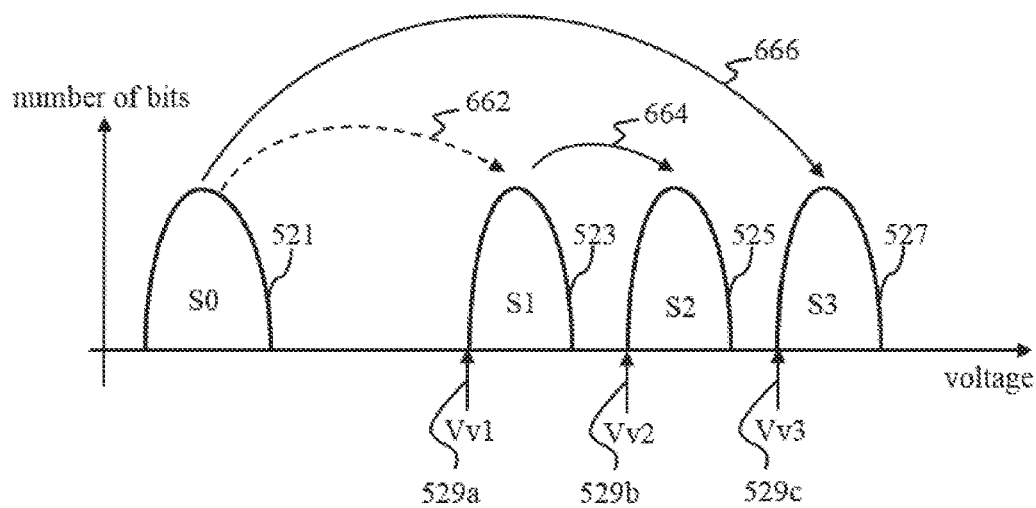
Figure 6C:
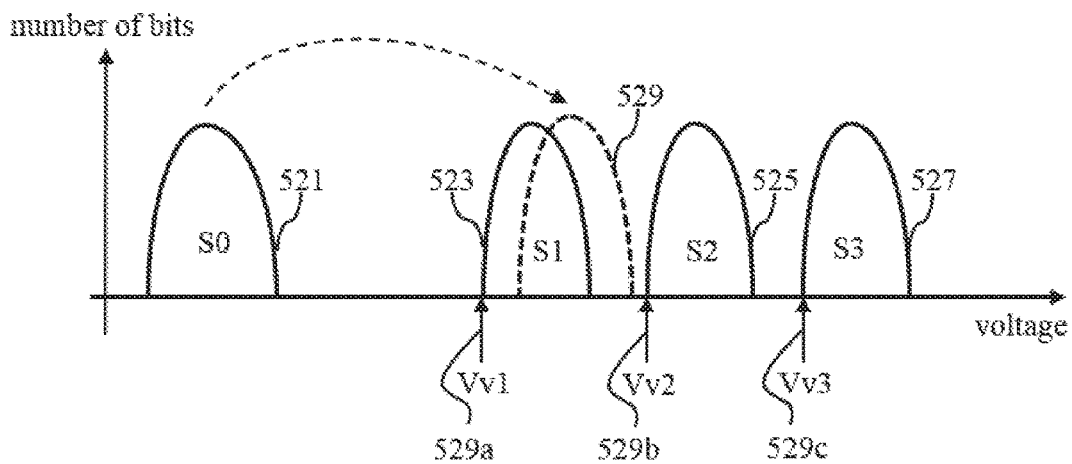

FIGS. 6A, 6B and 6C are diagrams illustrating examples of schemes for programming a storage device in accordance with some embodiments of the present disclosure. In some embodiments, one or more of these programming schemes can be used to program the storage device to program states "S0," "S1," "S2," and/or "S3" corresponding to threshold voltage distributions 521, 523, 525, and 527 as described above in connection with FIG. 5B.

As shown in FIG. 6A, one or more storage elements of the storage device can be programmed to program states "S0," "S1," "S2," and/or "S3" during one or more programming rounds 642, 644, and/or 646. Programming rounds 642, 644, and 646 can be executed in parallel, sequentially, and/or in any other suitable manner. Each of programming rounds 642, 644, and 646 can be executed by performing one or more operations as described below in connection with FIGS. 8-10.

In some embodiments, one or more storage elements that have been programmed to a first program state can be further programmed to one or more other program states. For example, a storage element that has been programmed to state "S0" can be programmed to states "S1," "S2," and/or "S3" during programming rounds 642, 644, and 646, respectively.

Turning to FIG. 6B, a scheme for programming storage elements that can store multiple bits of data in accordance with some embodiments of the disclosed subject matter is shown. As illustrated, the storage elements can be programmed to program states "S0," "S1," "S2," and/or "S3" during one or more programming rounds 662, 664, and 666.

In some embodiments, the storage elements can be grouped into one or more logical and/or physical groups, such as one or more logic pages. A logic page may include one or more storage elements that are coupled to a word line of the storage device. In some embodiments, the storage elements can be grouped into multiple logic pages (e.g., a logic page associated with the Least Significant Bit (LSB), a logic page associated with the Most Significant Bit (MSB), a middle logic page, etc.).

The storage elements can be programmed to store multiple bits of data during multiple programming rounds. As an example, program states "S0," "S1," "S2," and "S3" may correspond to values of "11," "10," "00," and "01," respectively. In some embodiments, a particular amount of data (e.g., a bit of data) can be stored in a page of storage elements during a programming round. In such an example, during a first program round 662, a first page of storage elements (e.g., a page associated with the LSB) can be programmed to program state "S1". For example, if the first page of storage elements are programmed to store a value of "1", the threshold voltages of the storage elements may not have to be changed. As another example, if the first page of storage elements are programmed to store a value of "0," the threshold voltages of the storage elements in the first page can be increased until the storage elements are programmed to stat "S1." In some embodiments, the first page of storage elements can be programmed to state "S1" as described below in connection with FIGS. 8-10.

During a second programming round 664 or 666, a second page of storage elements (e.g., a page of storage elements associated with the MSB) can be programmed (e.g., by performing one or more operations described below in connection with FIGS. 8-10). For example, if the second page of storage elements are to be programmed to store a value of "1," the storage elements of the second logic page may be in program state "S0" (e.g., "11") or program state "S1" (e.g., "10") based on the data stored in the first page of storage elements. As another example, the second page of storage elements may be programmed to store a value of "0." In some embodiments in which the storage elements have been programmed to program state 525 (e.g., "11") in the first programming round 662, the storage elements of the device may be programmed to program state 527 (e.g., "01") in the second programming round. In some embodiments in which the storage elements have been programmed to program state 523 (e.g., "10") during the first programming round, the storage elements of the storage device may be programmed to program state 525 (e.g., "00") in the second programming round. In the second programming rounds 664 and/or 666, one or more verify operations may be performed to verify program state 525 (e.g., "00") and program state 527 (e.g., "01") after each program pulse.

Turning to FIG. 6C, one or more of the storage elements can also be programmed to a program state 529 that represents an intermediary state. For example, one or more storage elements that have been programmed to program state 521 can be further programmed to program state 529 in a first programming round. A verify operation may be performed to determine whether the storage elements have been programmed to program state 529. The storage elements can then be programmed from program state 529 to one or more of program states 525 and 527 in one or more subsequent programming round. In some embodiments, one or more storage elements may also be programmed from program state 521 to program state 523 in a subsequent programming round. One or more verify operations can be performed to determine whether the storage elements have been programmed to program states 523, 525, and/or 527. In some embodiments, multiple intermediary program states can be used to program the storage elements.

Figure 7A:
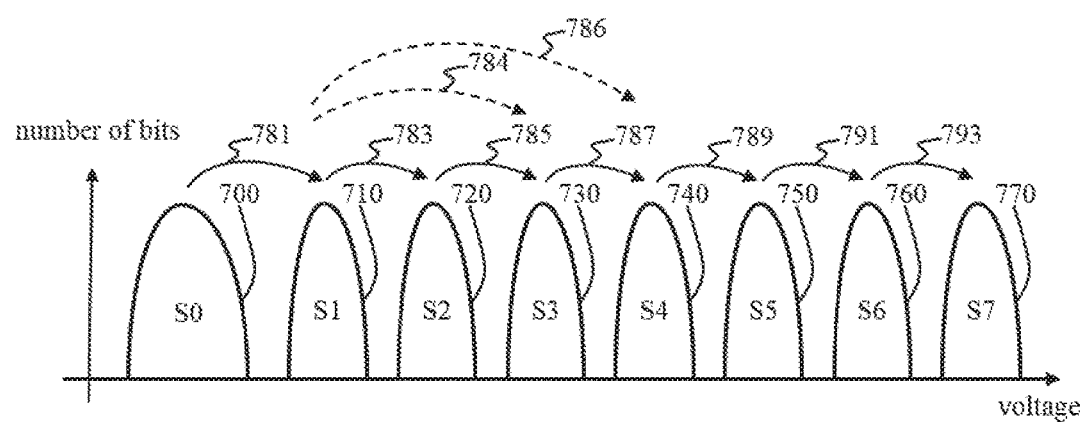
Figure 7B:
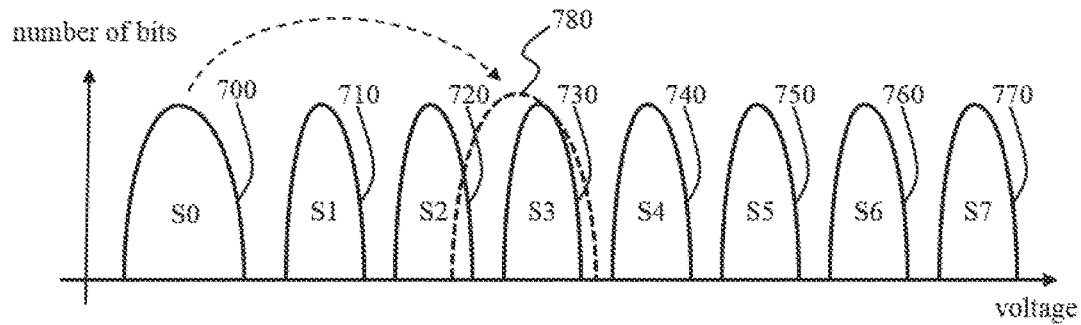

FIGS. 7A and 7B are diagrams illustrating examples of schemes for programming storage elements that can store multiple bits of data in accordance with some embodiments of the present disclosure. In some embodiments, one or more of these programming schemes can be used to program the storage elements to program states 700, 710, 720, 730, 740, 750, 760, and/or 770 as illustrated in FIG. 5C.

As shown in FIG. 7A, one or more storage elements of the storage device can be programmed to program states 700, 710, 720, 730, 740, 750, 760, and/or 770 in multiple programming rounds. For example, during a first programming round 781, the storage elements of the storage device can be programmed from state 700 to state 710. During a subsequent programming round 783, one or more of the storage elements can be programmed from state 710 to state 720. Similarly, the storage elements can then be programmed to states 730, 740, 750, and 760 during subsequent programming rounds 785, 787, 789, 791, and 793, respectively.

As another example, after being programmed to state 710 during programming round 781, one or more of the storage elements can be programmed from state 700 to state 710 during programming round 783. Similarly, one or more of the storage elements can be programmed from state 710 to state 730 during programming round 784. One or more of the storage elements can be programmed from state 710 to state 740 during programming round 786. One or more of the storage elements can also be programmed from state 710 to states 750, 760, and 770, respectively, during one or more programming rounds (not shown in FIG. 7A).

Turning to FIG. 7B, one or more of the storage elements can also be programmed to a program state 780 that represents an intermediary state. For example, one or more storage elements that have been programmed to program state 700 can be further programmed to program state 780. A verify operation may be performed to determine whether the storage elements have been programmed to program state 780. The storage elements can then be programmed from program state 780 to one or more of program states 710, 720, 730, 740, 750, 760, and 770. One or more verify operations can be performed to determine whether the storage elements have been programmed to program states 710, 720, 730, 740, 750, 760, and/or 770. In some embodiments, multiple intermediary program states can be used to program the storage elements.

Figure 8:
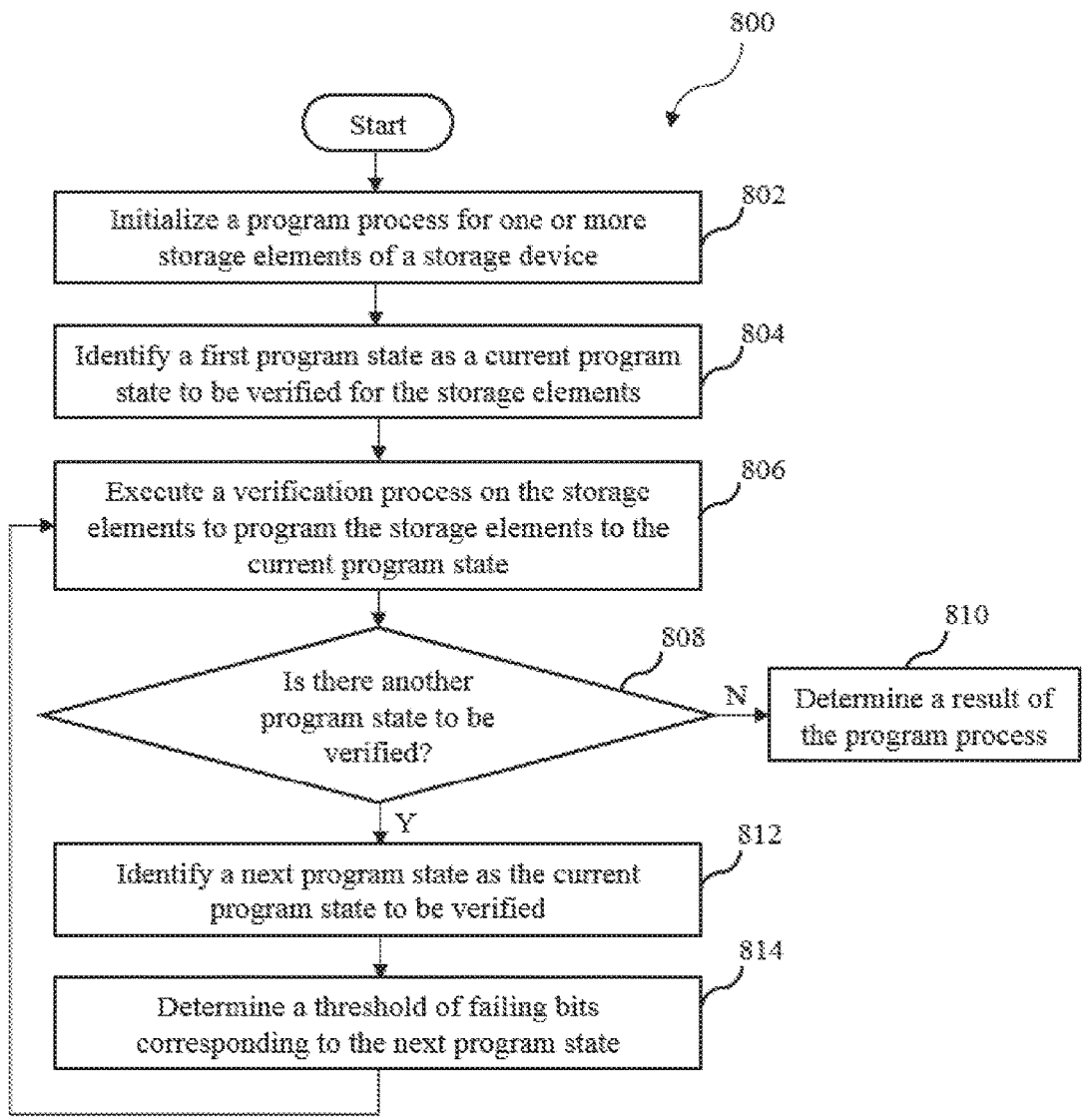
FIG. 8 is a flow chart illustrating an example of a process for programming a storage device in accordance with some embodiments of the disclosed subject matter.

FIG. 8 is a flow chart illustrating an example 800 of a process for programming a storage device in accordance with some embodiments of the present disclosure. In some embodiments, the storage device can be and/or include a storage device described above in connection with FIGS. 1-4.

At 802, process 800 can initialize a program process for one or more storage elements of the storage device. In some embodiments, the storage elements can be coupled to a given word line of the storage device (e.g., a page of storage elements). Process 800 can initialize the program process by performing one or more operations. For example, process 800 can identify one or more program states corresponding to the storage elements (e.g., program states "S0" and "S1" as described above in connection with FIG. 5A, program states "S0," "S1," "S2," and "S3" as described above in connection with FIG. 5B, program states "S0," "S1," "S2," "S3," "S4," "S5," "S6," and "S7" as described above in connection with FIG. 5C, etc.).

In some embodiments, process 800 can identify the program states based on any suitable information about the storage elements and/or the storage device, such as an amount of data (e.g., the number of bits of data) that can be stored in the storage elements, a type of programming scheme to be utilized to program the storage elements (e.g., one or more programming schemes described above in connection with FIGS. 5A-7B), etc. In a more particular example, a storage element that can store one bit of data can correspond to two program states, such as a program state indicating that the storage element has no charge present on the floating gate of the storage element and a program state indicating that the storage element has charges present on the floating gate of the storage element. In another more particular example, a storage element that can store multiple bits of data can correspond to a program state representative of the storage element having no charge present on the floating gate of the storage element and/or multiple program states indicating that the storage element has charges on the floating gate of the storage element. In some embodiments, a storage element that can store N bits of data can correspond to $2^N-1$ program states, where N is a positive integer. In some embodiments, one or more of the program states may be skipped, and the number of program states to be programmed and/or verified for a $2^n$-level storage element may be less than $2^n-1$.

At 804, process 800 can identify a first program state as a current program state to be verified for the storage elements. For example, process 800 can select a program state from the program states identified at 802 as being the first program state. In some embodiments, the first program state can be a program state corresponding to a particular target voltage (e.g., the lowest target voltage, an intermediate target voltage, the second lowest target voltage, and/or any other suitable target voltage) or a particular threshold voltage distribution (e.g., a threshold voltage distribution corresponding to the particular target voltage).

In some embodiments, the program states may correspond to one or more thresholds of failing bits. For example, a given program state can correspond to an individual threshold of failing bits representing the number of bits that are allowed to fail when the storage elements are successfully programmed to the given program state. In some embodiments, multiple program states may correspond to multiple individual threshold of failing bits that may or may not be the same.

As another example, the program states can correspond to a combined threshold of failing bits that represent a total number of bits that are allowed to fail when the storage elements are successfully programmed to multiple program states. In some embodiments, the combined threshold of failing bits can be a combination of multiple individual failing bits corresponding to multiple program states.

In some embodiments, each of the program states can correspond to a threshold number of program pulses that may represent a maximum number of program pulses that can be applied to a storage element to program the storage element to a program state. Multiple program states can correspond to multiple threshold numbers of program pulses that may or may not be the same.

At 806, process 800 can execute a verification process on the storage elements to program the storage elements to the current program state. In some embodiments, the verification process can be executed by performing one or more operations as described below in connection with FIG. 9.

At 808, process 800 can determine whether there is another program state to be verified. For example, process 800 can determine whether each of the program states identified at 802 has been verified for the storage elements. In response to determining that there is no other program state to be verified (e.g., "NO" at block 808), process 800 can proceed to 810 and can determine a result of the program process. For example, in response to determining that the storage elements have not passed the verification process, process 800 can determine that the program process is not successful. Alternatively, in response to determining that the storage elements have passed the verification process, process 800 can determine that the storage elements have failed the verification process.

In some embodiments, in response to determining that there is one or more program states to be verified (e.g., "YES" at 808), process 800 can proceed to 812 and can identify a next program state as the current program state to be verified. For example, process 800 can identify the next program state in the preset data sequence (e.g., 653, 655, 657, as shown in FIG. 6A) as being the current program state to be verified. At 814, process 800 can determine a threshold of failing bits corresponding to the next program state. The threshold of failing bits can be determined based on information related to the verification process executed on the storage elements, such as an indication that the storage elements have passed or failed the verification process, the number of failing bits detected during the verification process, etc. The threshold of failing bits may also be determined based on information related to an initial value of the threshold of failing bits corresponding to the next program state (e.g., a predetermined threshold of failing bits corresponding to the next program state), one or more thresholds of failing bits corresponding to one or more other program states (e.g., predetermined thresholds of failing bits corresponding to program states to be verified), etc. For example, the threshold of failing bits corresponding to the next program state can be determined by combining the initial value of the threshold of failing bits and a difference between the detected failing bits corresponding to the first program state and a threshold of failing bits corresponding to the first program state. In some embodiments, the threshold of failing bits corresponding to the next program state can be determined by performing one or more operations as described below in connection with FIG. 10.

In some embodiments, upon executing block 814, process 800 can loop back to block 806 and can execute a verification process on the storage elements to program the storage elements to the next program state (e.g., by executing one or more operations described below in connection with FIG. 9).

Figure 9:
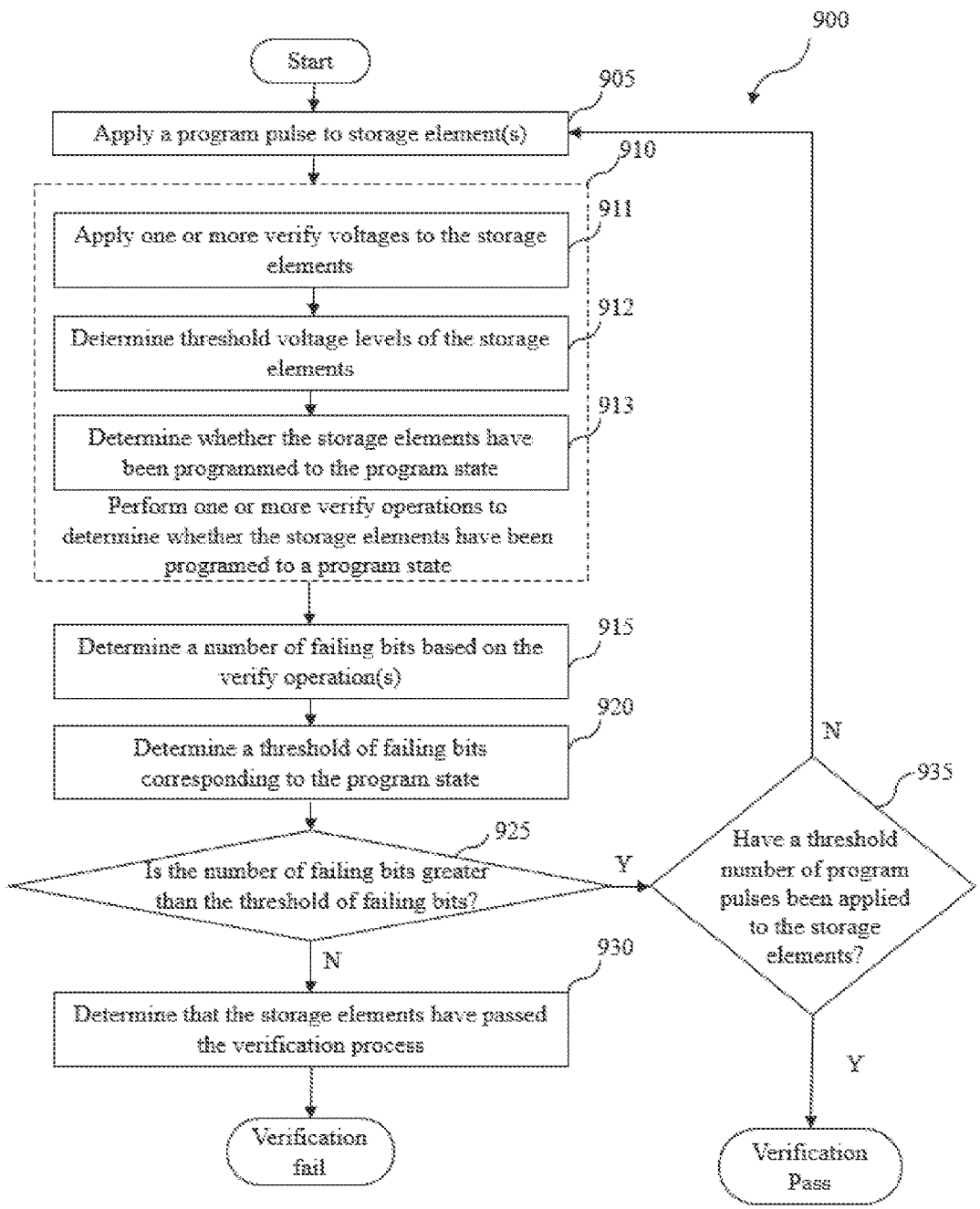
FIG. 9 is a flowchart illustrating an example of a process for verifying a program state in accordance with some embodiments of the disclosed subject matter.

FIG. 9 is a flowchart illustrating an example 900 of a process for verifying a program state in accordance with some embodiments of the disclosed subject matter.

As shown, at 905, process 900 can apply a program pulse to one or more storage elements of a storage device to program the storage elements to a program state. For example, the program pulse can be applied to a given word line coupled to the storage elements (e.g., a word line coupled to a page of storage elements). In some embodiments, various voltages can be applied to the given word line and one or more other word lines of the storage device. In some embodiments, the program pulse may have a predefined amplitude and/or duration. For example, one or more of program pulses 1101, 1103, 1105, 1107, 1109, 1111, 1133, 1135, 1139, 1141, and 1143 as described below in connection with FIGS. 11A-B may be applied to the storage elements.

At 910, process 900 can perform one or more verify operations to determine whether the storage elements have been programmed to the program state. For example, process 900 can determine whether each of the storage elements has reached a target threshold voltage and/or a threshold voltage distribution corresponding to the program state. In some embodiments, the verify operations may include operations depicted in blocks 911, 912, 913, and/or any other operation.

At 911, process 900 can apply one or more verify pulses to the storage elements (e.g., by applying the verify pulse(s) to the word line coupled to the storage elements). The verify pulse(s) may have any suitable amplitude and/or duration. For example, an amplitude of a verify pulse may be determined based on a target threshold voltage corresponding to the program state. As another example, multiple verify pulse(s) may have various amplitudes (e.g., incremental amplitudes). In a more particular example, one or more of verify pulses 1113, 1115, 1117, 1119, 1121, 1123, 1125, 1127, 1129, 1131, etc. as described below in connection with FIGS. 11A-B may be applied to the storage elements. In some embodiments, multiple verify pulses can be applied to the storage elements sequentially, in parallel, and/or in any other suitable manner.

In some embodiments, at 912, process 900 can determine threshold voltage values of the storage elements. For example, process 900 can applying a voltage to the floating gate of each of the storage elements and/or can perform a read operation.

At 913, process 900 can determine whether the storage elements have been programmed to the program state. For example, process 900 can determine that a given storage element has been programmed to the program state in response to determining that the threshold voltage value of the given storage element is equal to or greater than a target voltage corresponding to the program state. As another example, process 900 can determine that a given storage element has been programmed to the program state in response to determining that the threshold voltage level of the given storage element falls within a threshold voltage distribution corresponding to the program state.

At 915, process 900 can determine a number of failing bits. For example, process 900 can determine the number of failing bits based on the number of storage elements that have not been programmed to the program state (e.g., by performing a bitscan and/or any other operation). In some embodiments, this determination can be made by sense module 270 in response to a verify control gate voltage applied to the selected word line (e.g., a voltage applied by row decoder 220 of FIG. 2).

At 920, process 900 can determine a threshold of failing bits corresponding to the program state. The threshold of failing bits may be determined based on information related to the program state and/or any other program state. For example, process 900 can determine the threshold of failing bits based on information related to one or more other program states (e.g., one or more previous program states that have been verified during process 900, one or more subsequent program states to be verified during process 900, and/or any other program state, etc.). In a more particular example, the threshold of failing bits may be determined based on the number of failing bits detected during verification processes executed on one or more previous program states (e.g., the previous program states that have been verified during process 900). In another more particular example, the threshold of failing bits may be determined based on one or more thresholds of failing bits corresponding to one or more subsequent program states (e.g., individual thresholds of failing bits corresponding to the subsequent program states, a combination of multiple individual thresholds of failing bits corresponding to the subsequent program states, etc.).

As another example, process 900 can determine the threshold of failing bits based on a predetermined value of failing bits corresponding to the first program state (e.g., a particular number of failing bits allowed to fail when the storage device is to be programmed to the first program state, a number and/or percentage of storage elements allowed for the first program state, etc.).

In some embodiments, the threshold of failing bits can be determined by performing one or more operations described below in connection with FIG. 10.

In some embodiments, the threshold of failing bits can be determined using any suitable algorithm, such as one or more linear algorithms, nonlinear algorithms (e.g., exponential algorithm, logarithm algorithm, quadratic function algorithm, etc.), etc.

At 925, process 900 can determine whether the number of failing bits is greater than the threshold of failing bits. In some embodiments, process 900 can determine that the number of failing bits is greater than the threshold of failing bits in response to determining that the difference between the number of failing bits and the threshold of failing bits is not greater than a certain value.

In some embodiments, in response to determining that the number of failing bits is not greater than the threshold of failing bits (e.g., "NO" at block 925), process 900 can determine that the storage elements have passed the verification process at 930. Additionally or alternatively, process 900 can store the number of failing bits detected at 915, an indication that the storage elements have passed the verification process, and/or any other information related to the verification process.

Alternatively, in response to determining that the number of failing bits is greater than the threshold of failing bits (e.g., "YES" at block 925), process 900 can proceed to 935 and can determine whether a threshold number of program pulses have been applied to the storage elements. In some embodiments, the number of program pulses that have been applied to the storage elements can be determined based on a counter that is set to track the number of program pulses having been applied to the storage elements during a programming and/or verification process.

In response to determining that the threshold number of program pulses have been applied to the storage elements, process 900 can determine that the storage elements have not passed the verification process. Additionally or alternatively, process 900 can store the number of failing bits detected at 915, an indication that the storage elements have not passed the verification process, and/or any other information related to the verification process.

Alternatively, in response to determining that the number of program pulses that has been applied to the storage elements is not greater than the threshold of program pulses ("YES" at block 925), process 900 can loop back to 910 and can apply another program pulse (e.g., a program pulse having an incremental amplitude) to the storage elements to program the storage elements to the program state.

Figure 10:
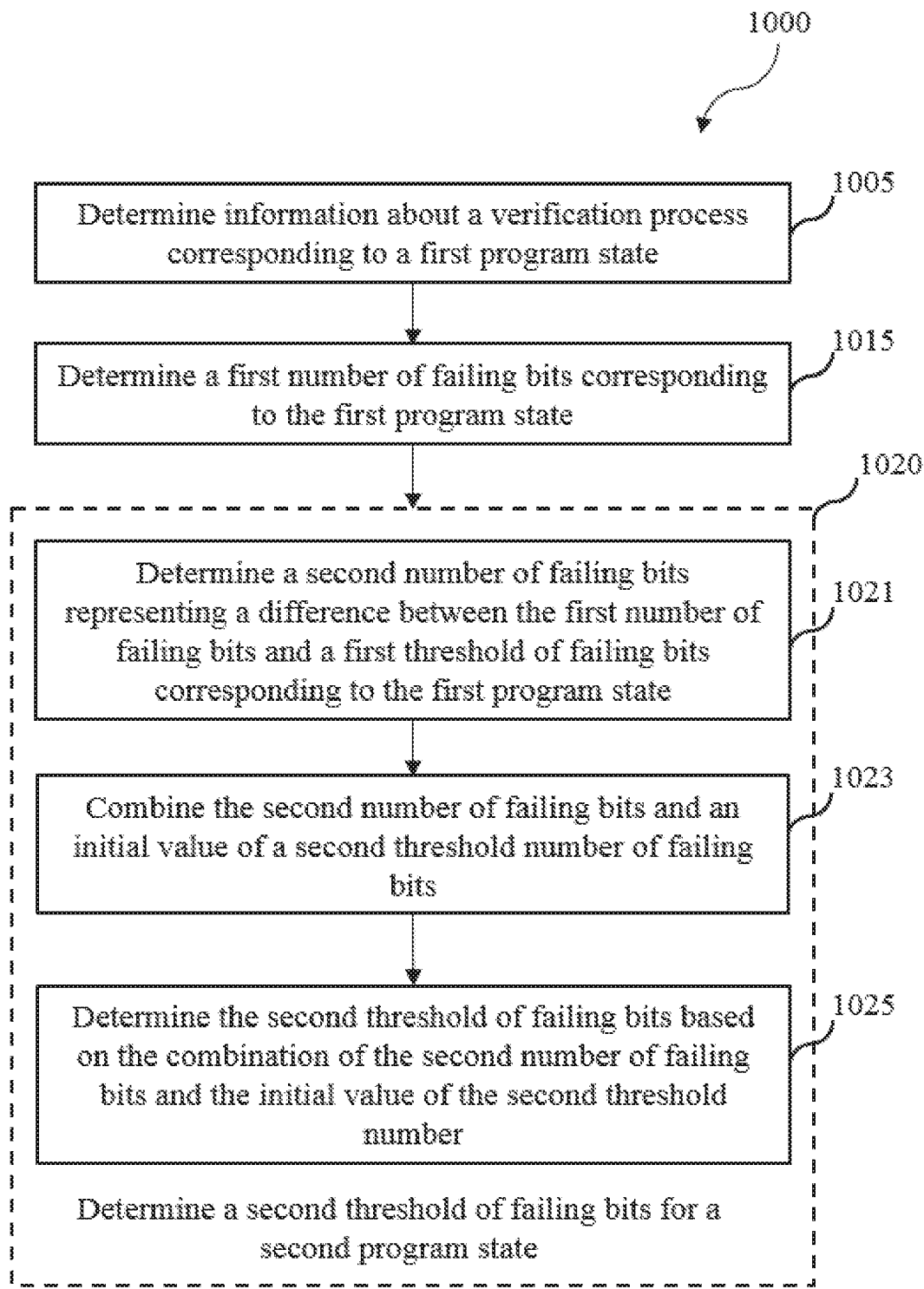
FIG. 10 is a flowchart illustrating an example of a process for determining thresholds of failing bits for one or more program states in accordance with some embodiments of the disclosed subject matter.
Figure 11:
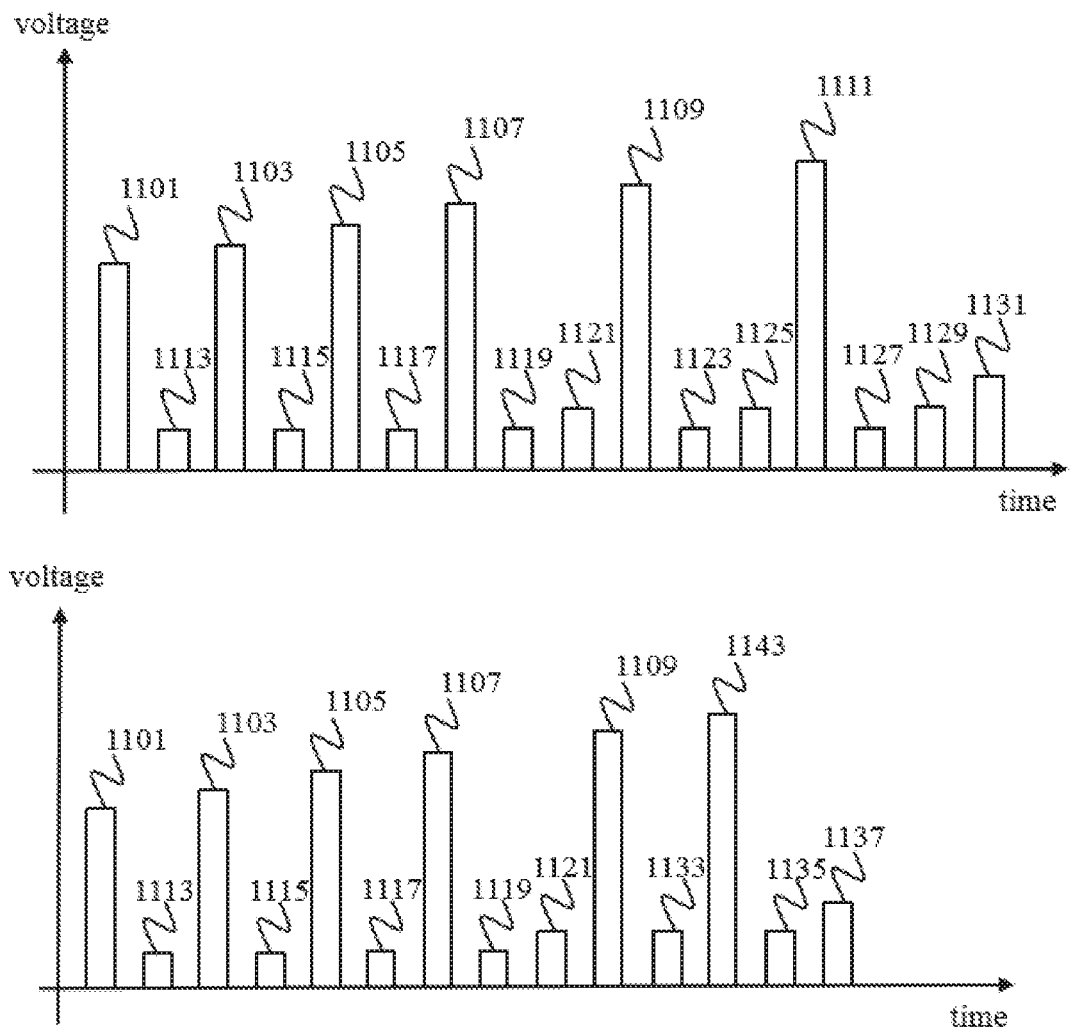
FIG. 11 illustrates examples of program pulses and verify pulses that can be used to program a storage device in accordance with some embodiments of the disclosed subject matter.

FIG. 10 is a flowchart illustrating an example 1000 of a process for determining thresholds of failing bits for one or more program states in accordance with some embodiments of the disclosed subject matter.

As shown, process 1000 may start at 1005 where information about a verification process corresponding to a first program state can be determined. The result of the verify operation(s) can include an indication that the storage elements have not passed the verification process, an indication that the storage elements have passed the verification process, the number of failing bits detected during the verification process, and/or any other suitable information related to the verification process. In some embodiments, the verification process can be executed by performing one or more operations as described above in connection with FIG. 9.

At 1015, process 1000 can determine a first number of failing bits corresponding to the first program state. For example, the first number of failing bits can be determined by performing one or more operations as described above in connection with 915.

At 1020, process 1000 can determine a second threshold of failing bits for a second program state. For example, process 1000 can determine the second threshold of failing bits based on the failing bits detected by performing one or more operations of process 900, the indication that the storage elements have passed or failed the verification process, etc. In some embodiments, the second threshold of failing bits can be determined by performing one or more operations depicted in blocks 1021-1025.

At block 1021, process 1000 can determine a second number of failing bits representing a difference between the first number of failing bits and a first threshold of failing bits corresponding to the first program state. The first threshold of failing bits can be an individual threshold of failing bits corresponding to the first program state. The first threshold of failing bits can be a predetermined value in some embodiments.

At 1023, process 1000 can combine the second number of failing bits and an initial value of a second threshold number (e.g., by determining a weighted sum of the second number of failing bits and the initial value, a weighted average of the difference and the initial value, etc.). For example, in some embodiments in which the storage elements have passed the verification process, process 1000 can determine a sum of the second number of failing bits and the initial value of the second threshold number. As another example, in some embodiments in which the storage elements have failed the verification process, process 1000 can subtract the second number of failing bits from the initial value of the second threshold of failing bits.

In some embodiments, the initial value of the second threshold may correspond to an individual threshold of failing bits representing the maximum number of failing bits that are allowed to successfully program the storage elements to the second program state. The individual threshold of failing bits can be and/or include a value determined based on the number of failing bits detected during verification processes executed for one or more previous program states, a predetermined value (e.g., a value determined based on the number of bits that can be corrected by an error correction circuit), etc.

In some embodiments, the initial value of the second threshold may correspond to a combined threshold of failing bits representing a combination of individual thresholds of failing bits corresponding to the second program state and/or one or more other program states to be verified. The combined threshold of failing bits can be and/or include a weighted sum, a weighted average, and/or any other suitable combination of the individual thresholds of failing bits. In some embodiments, each of the individual thresholds and/or program states to be verified can correspond to a weight that can be used to determine the combined threshold of failing bits.

At 1025, process 1000 can determine the second threshold of failing bits based on the combination of the second number of failing bits and the initial value of the second threshold of failing bits. For example, process 1000 can determine that the second threshold of failing bits is the combination of the second number of failing bits and the initial value of the second threshold of failing bits (e.g., an initial value of an individual threshold of failing bits corresponding to the second program state). As another example, process 1000 can determine the second threshold of failing bits based on a percentage of the combination of the second number of failing bits and the initial value of the second threshold of failing bits (e.g., an initial value of a combination of individual thresholds of failing bits corresponding to the second program state and/or one or more program states to be verified). The percentage can be determined based on any suitable information. For example, the percentage can be determined based on a weight corresponding to the second program (e.g., a weight used to calculate the combination of individual thresholds of failing bits corresponding to the program states to be verified). As another example, the percentage can be determined based on a number of the program states to be verified. More particularly, for example, process 1000 may determine that the percentage is 50% upon determining that two program states are to be verified.

In some embodiments, process 1000 can be executed iteratively to dynamically calculate the number of bits that are allowed to fail corresponding to a current program state based on the number of failing bits detected during program operations performed for one or more previous program states (e.g., program states that have been verified for the storage device).

In some embodiments, one or more of processes 800, 900, and 1000 can be performed by a processor including one or more of voltage generators 230, logic 240, column decoder 250, read/write module 260, sense module 270, and memory controller 106 as described above in connection with FIG. 2.

It should be noted that the above steps of the flow diagrams of FIGS. 8-10 can be executed or performed in any order or sequence not limited to the order and sequence shown and described in the figures. Also, some of the above steps of the flow diagrams of FIGS. 8-10 can be executed or performed substantially simultaneously where appropriate or in parallel to reduce latency and processing times. Furthermore, it should be noted that FIGS. 8-10 are provided as examples only. At least some of the steps shown in these figures may be performed in a different order than represented, performed concurrently, or altogether omitted.

FIG. 1100 illustrates examples of program pulses and/or verify pulses that can be used to program a storage device in accordance with some embodiments of the disclosed subject matter. In some embodiments, one or more storage elements of the storage device (e.g., storage elements coupled to a word line of the storage device) can be programmed to one or more program states using the program pulses and/or the verify pulses. As an example, the storage elements can be programmed to multiple program states, such as a first program state, a second program state, and a third program state. The program states can correspond to one or more thresholds of failing bits.

As shown, program pulses 1101, 1103, 1105, 1107, 1109, and 1111 can be applied to the storage elements to program the storage elements to one or more program states. Verify pulses 1113, 1115, 1117, 1119, 1121, 1123, 1125, 1127, 1129, and 1131 can be applied to the storage elements to verify whether the storage elements have been programmed to one or more of the program states.

For example, program pulse 1101 can be applied to the storage elements to program the storage elements to a first program state. Verify pulse 1113 can then be applied to the storage elements during a verification process to determine whether the storage elements have been programmed to the first program state (e.g., by determining whether each of the threshold voltages of the storage elements is greater than or equal to the value of verify pulse 1113). Additionally, a number of failing bits corresponding to the first program state can be determined during the verify operation (e.g., by determining a number of storage elements corresponding to threshold voltage levels less than the value of verify pulse 1113). In some embodiments, in response to determining that the number of failing bits is less than the first threshold of failing bits, the processor can cause one or more program pulses to be applied to the storage elements to program the storage elements to the second program state.

Alternatively, in some embodiments in which the number of failing bits is greater than or equal to the first threshold of failing bits, program pulses 1103 and/or 1105 may be applied to the storage elements to program the storage elements to the first program state. Verify pulses 1115 and/or 1117 may be applied to the storage elements after the application of program pulses 1103 and/or 1105 to the storage elements.

In some embodiments, program pulses 1107 and/or 1109 can be applied to the storage elements to program the storage elements to a second program state. Verify pulses 1119, 1121, 1123, 1125, and/or 1133 can then be applied to the storage device to verify whether the storage elements have been programmed to the third program state.

In some embodiments, program pulse 1111 can be applied to the storage elements to program the storage elements to a third program state. Verify pulses 1127, 1129, 1131, 1135, and/or 1137 can then be applied to the storage device to verify whether the storage elements have been programmed to the third program state.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "determining," "programming," "assigning," "providing," "executing," "verifying," "storing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The terms "first," "second," "third," "fourth," etc. as used herein are meant as labels to distinguish among different elements and may not necessarily have an ordinal meaning according to their numerical designation.

The disclosure also relates to an apparatus for performing the operations herein. This apparatus may be specially constructed for the purposes, or it may comprise a general purpose computer selectively activated or reconfigured by a computer program stored in the computer. Such a computer program may be stored in a machine readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, flash memories (e.g., NOR flash memories, NAND flash memories, etc.) or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the method steps. The structure for a variety of these systems will appear as set forth in the description below. In addition, the disclosure is not described with reference to any particular programming language. It will be appreciated that a variety of programming languages may be used to implement the teachings of the disclosure as described herein.

What is claimed is:

1. A method for programming a storage device, comprising:
   performing a verify operation on a plurality of storage elements of the storage device to determine whether the plurality of storage elements have been programmed to a first program state;
   determining a first number of failing bits corresponding to the first program state based on the verify operation;
   comparing the first number of failing bits with a first threshold of failing bits corresponding to the first program state; and
   determining a second threshold of failing bits based at least in part on the first number of failing bits and the comparison, wherein the second threshold of failing bits corresponds to a second program state.

2. The method of claim 1, further comprising determining a second number of failing bits representative of a difference between the first number of failing bits and the first threshold of failing bits.

3. The method of claim 2, wherein determining the second threshold failing bits further comprises combining an initial value of the second threshold of failing bits and the second number of failing bits.

4. The method of claim 2, further comprising determining whether a threshold of program pulses have been applied to the plurality of storage elements.

5. The method of claim 1, wherein performing the verify operation comprises applying a verify pulse to the plurality of storage elements.

6. The method of claim 1, wherein performing the verify operation comprises:
determining a plurality of threshold voltages corresponding to the plurality of storage elements; and
determining whether the plurality of threshold voltages have reached a target threshold voltage distribution.

7. The method of claim 1, wherein determining the first number of failing bits based on the verify operation comprises determining a number of the plurality of storage elements that have not been programmed to the first program state.

8. A non-transitory machine-readable storage medium storing instructions which, when executed, cause a processor to:
perform a verify operation on a plurality of storage elements of the storage device to determine whether the plurality of storage elements have been programmed to a first program state;
determine a first number of failing bits corresponding to the first program state based on the verify operation;
compare the first number of failing bits with a first threshold of failing bits corresponding to the first program state; and
determine a second threshold of failing bits based at least in part on the first number of failing bits and the comparison, wherein the second threshold of failing bits corresponds to a second program state.

9. The non-transitory machine-readable storage medium of claim 8, wherein the processor is further to determine a second number of failing bits representative of a difference between the first number of failing bits and the first threshold of failing bits.

10. The non-transitory machine-readable storage medium of claim 9, wherein updating the second threshold of failing bits comprises combining an initial value of the second threshold of failing bits and the second number of failing bits.

11. The non-transitory machine-readable storage medium of claim 10, wherein the processor is further to determine whether a threshold of program pulses have been applied to the plurality of storage elements.

12. The non-transitory machine-readable storage medium of claim 10, wherein to perform the verify operation, the processor is further to apply a verify pulse to the plurality of storage elements.

13. The non-transitory machine-readable storage medium of claim 10, wherein, to perform the verify operation, the processor is further to:
determine a plurality of threshold voltages corresponding to the plurality of storage elements; and
determine whether the plurality of threshold voltages have reached a target threshold voltage distribution.

14. The non-transitory machine-readable storage medium of claim 10, wherein to determine the first number of failing bits based on the verify operation, the processor is further to determine a number of the plurality of threshold voltages that have not been programmed to the first program state.

15. A system for programming a storage device, comprising:
at least one processor, to:
perform a verify operation on a plurality of storage elements of the storage device to determine whether the plurality of storage elements have been programmed to a first program state;
determine a first number of failing bits corresponding to the first program state based on the verify operation;
compare the first number of failing bits with a first threshold of failing bits corresponding to the first program state; and
determine a second threshold of failing bits based at least in part on the first number of failing bits and the comparison, wherein the second threshold of failing bits corresponds to a second program state.

16. The system of claim 15, wherein the processor is further to determine a second number of failing bits representative of a difference between the first number of failing bits and the first threshold of failing bits.

17. The system of claim 15, wherein to update the second threshold of failing bits, the processor is further to combine an initial value of the second threshold of failing bits and the second number of failing bits.

18. The system of claim 15, wherein the processor is further to determine whether a threshold of program pulses have been applied to the plurality of storage elements.

19. The system of claim 15, wherein, to perform the verify operation, the processor is further to:
determine a plurality of threshold voltages corresponding to the plurality of storage elements; and
determine whether the plurality of threshold voltages have reached a target threshold voltage distribution.

20. The system of claim 15, wherein to determine the first number of failing bits based on the verify operation, the processor is further to determine a number of the plurality of threshold voltages that have not been programmed to the first program state.

* * * * *